US012089327B2

(12) United States Patent
Arimoto et al.

(10) Patent No.: US 12,089,327 B2
(45) Date of Patent: Sep. 10, 2024

(54) METAL-COATED LIQUID-CRYSTAL POLYMER FILM

(71) Applicant: KURARAY CO., LTD., Kurashiki (JP)

(72) Inventors: Kikuo Arimoto, Kamisu (JP); Takafumi Sawada, Saijo (JP); Yuuichi Banba, Kyoto (JP); Shuji Nagano, Kyoto (JP)

(73) Assignee: KURARAY CO., LTD., Kurashiki (JP)

( * ) Notice: Subject to any disclaimer, the term of this patent is extended or adjusted under 35 U.S.C. 154(b) by 0 days.

(21) Appl. No.: 18/046,280

(22) Filed: Oct. 13, 2022

(65) Prior Publication Data

US 2023/0076995 A1 Mar. 9, 2023

Related U.S. Application Data

(63) Continuation of application No. PCT/JP2021/014854, filed on Apr. 8, 2021.

(30) Foreign Application Priority Data

Apr. 17, 2020 (JP) ................................ 2020-073960

(51) Int. Cl.
*H05K 1/03* (2006.01)
*B32B 15/04* (2006.01)
(Continued)

(52) U.S. Cl.
CPC ........... *H05K 1/0353* (2013.01); *B32B 15/04* (2013.01); *B32B 15/043* (2013.01); *B32B 15/08* (2013.01);
(Continued)

(58) Field of Classification Search
CPC .... H05K 3/022; H05K 1/0353; H05K 1/0313; H05K 1/09; H05K 1/0393;
(Continued)

(56) References Cited

U.S. PATENT DOCUMENTS

2014/0023881 A1 1/2014 Sakaguchi et al.
2016/0236402 A1* 8/2016 Nakashima ................ C09J 5/06

FOREIGN PATENT DOCUMENTS

JP 2010-165877 A 7/2010
JP 4646580 B2 3/2011
(Continued)

OTHER PUBLICATIONS

International Search Report issued Jun. 22, 2021 in PCT/JP2021/014854 filed Apr. 8, 2021, 3 pages.
(Continued)

*Primary Examiner* — Michael E. La Villa
(74) *Attorney, Agent, or Firm* — Oblon, McClelland, Maier & Neustadt, L.L.P.

(57) ABSTRACT

Provide is a metal-coated liquid-crystal polymer film that is suitable for microcircuit processing and capable of reducing the transmission loss of circuits. The metal-coated liquid-crystal polymer film comprising: a polymer film comprising a polymer film main body capable of forming an optically anisotropic melt phase; a first metal layer layered on at least one side of the polymer film main body; and a second metal layer layered on the first metal layer, wherein in an analysis of oxygen concentration in a thickness direction using XPS, the average oxygen concentration of the first metal layer is 2.5 atom % or less.

16 Claims, 1 Drawing Sheet

(51) Int. Cl.

| | |
|---|---|
| ***B32B 15/08*** | (2006.01) |
| ***B32B 15/18*** | (2006.01) |
| ***B32B 15/20*** | (2006.01) |
| ***C08J 5/18*** | (2006.01) |
| ***C09K 19/00*** | (2006.01) |
| ***C09K 19/02*** | (2006.01) |
| ***C23C 14/20*** | (2006.01) |
| ***H05K 1/09*** | (2006.01) |
| ***H05K 3/02*** | (2006.01) |

(52) U.S. Cl.

CPC .............. *B32B 15/18* (2013.01); *B32B 15/20* (2013.01); *C08J 5/18* (2013.01); *C09K 19/00* (2013.01); *C09K 19/02* (2013.01); *C23C 14/20* (2013.01); *C23C 14/205* (2013.01); *H05K 1/0313* (2013.01); *H05K 1/09* (2013.01); *H05K 3/022* (2013.01); *H05K 1/0393* (2013.01); *H05K 2201/0129* (2013.01); *H05K 2201/0141* (2013.01); *H05K 2201/0338* (2013.01); *Y10T 428/12556* (2015.01); *Y10T 428/12569* (2015.01); *Y10T 428/1266* (2015.01); *Y10T 428/12667* (2015.01); *Y10T 428/12708* (2015.01); *Y10T 428/12715* (2015.01); *Y10T 428/12722* (2015.01); *Y10T 428/12736* (2015.01); *Y10T 428/12743* (2015.01); *Y10T 428/1275* (2015.01); *Y10T 428/12757* (2015.01); *Y10T 428/12785* (2015.01); *Y10T 428/12806* (2015.01); *Y10T 428/12819* (2015.01); *Y10T 428/12826* (2015.01); *Y10T 428/12847* (2015.01); *Y10T 428/12854* (2015.01); *Y10T 428/12861* (2015.01); *Y10T 428/12868* (2015.01); *Y10T 428/12875* (2015.01); *Y10T 428/12882* (2015.01); *Y10T 428/12889* (2015.01); *Y10T 428/12896* (2015.01); *Y10T 428/12903* (2015.01); *Y10T 428/1291* (2015.01); *Y10T 428/12917* (2015.01); *Y10T 428/12931* (2015.01); *Y10T 428/12937* (2015.01); *Y10T 428/12944* (2015.01); *Y10T 428/12951* (2015.01); *Y10T 428/26* (2015.01); *Y10T 428/31678* (2015.04)

(58) Field of Classification Search

CPC ... H05K 2201/0129; H05K 2201/0141; H05K 2201/0338; C08J 5/18; C23C 14/205; C23C 14/20; C09K 19/00; C09K 19/02; B32B 15/04; B32B 15/043; B32B 15/18; B32B 15/20; Y10T 428/26; Y10T 428/31678; Y10T 428/12556; Y10T 428/12569; Y10T 428/1266; Y10T 428/12667; Y10T 428/12847; Y10T 428/12854; Y10T 428/12708; Y10T 428/12715; Y10T 428/12722; Y10T 428/12736; Y10T 428/12743; Y10T 428/1275; Y10T 428/12861; Y10T 428/12868; Y10T 428/12875; Y10T 428/12757; Y10T 428/12785; Y10T 428/12806; Y10T 428/12819; Y10T 428/12826; Y10T 428/12882; Y10T 428/12889; Y10T 428/12896; Y10T 428/12903; Y10T 428/1291; Y10T 428/12917; Y10T 428/12931; Y10T 428/12937; Y10T 428/12944; Y10T 428/12951

See application file for complete search history.

(56) References Cited

FOREIGN PATENT DOCUMENTS

| | | | |
|---|---|---|---|
| JP | 4924843 | B2 | 4/2012 |
| JP | 2015-32605 | A | 2/2015 |
| JP | 2017-39992 | A | 2/2017 |
| JP | 2021-41609 | A | 3/2021 |
| KR | 10-2019-0118546 | A | 10/2019 |
| TW | 201806093 | A | 5/2024 |
| WO | WO 2012/117850 | A1 | 9/2012 |
| WO | WO 2020/003946 | A1 | 1/2020 |

OTHER PUBLICATIONS

International Preliminary Report on Patentability and Written Opinion issued Oct. 27, 2022 in PCT/JP2021/014854 (submitting English Translation Only), 6 pages.

Office Action issued May 7, 2024, in corresponding Taiwanese Patent Application No. 110113699.

Extended and Supplementary Search Report issued Apr. 19, 2024, in corresponding European Patent Application No. 21789225.6.

* cited by examiner

METAL-COATED LIQUID-CRYSTAL POLYMER FILM

CROSS REFERENCE TO THE RELATED APPLICATION

This application is a continuation application, under 35 U.S.C. § 111(a), of international application No. PCT/JP2021/014854, filed Apr. 8, 2021, which claims priority to Japanese patent application No. 2020-073960, filed Apr. 17, 2020, the entire disclosures all of which are herein incorporated by reference as a part of this application.

BACKGROUND OF THE INVENTION

The present invention relates to a metal-coated liquid-crystal polymer film in which a metal layer is formed on the surface of a base material comprising a polymer film capable of forming an optically anisotropic melt phase (hereinafter abbreviated as "thermoplastic liquid crystal polymer film" or "liquid crystal polymer film"), and to a metal clad laminate including such a film in its laminated structure.

Electronic devices such as cell phones, digital cameras, and other portable electronic devices, in-vehicle electrical components, and electronic devices for home appliances are required to be smaller and lighter. Accordingly, flexible circuit boards using resin film as an insulating base material are being used and circuit patterns are being miniaturized. Further, the 5th generation mobile communication system (5G), which is currently under development, requires a reduction in transmission loss in circuit boards to support high frequencies of 10 GHz or more.

It has been known that flexible circuit boards which utilize liquid crystal polymer films as the insulating base materials can reduce transmission losses compared to conventional circuit boards which utilize polyimide or other materials as the insulating base materials. As a result, a variety of metal clad laminates which have metal layers on the liquid crystal polymers have been developed as circuit board materials. Various types of metal clad laminates manufactured by pressing a metallic foil such as copper foil onto a liquid crystal polymer film directly or via an adhesive layer have been developed and have been available in the market.

As a manufacturing method for metal clad laminates, a method of depositing a thin metal layer on a resin film by dry plating has also been studied. For example, Patent Document 1 discloses a two-layer flexible substrate in which a metal underlayer is formed directly on at least one side of an insulator film, and a copper conductor layer is formed onto the metal underlayer. The two-layer flexible substrate is characterized in that the metal underlayer mainly contains nickel-chromium or nickel-chromium-molybdenum solid-solubilizing oxygen atoms of 3.1 to 3.8 atom %. Patent Document 1 also describes that metal underlayer is formed by dry plating methods such as vacuum evaporation, sputtering, or ion plating.

The method of utilizing a low-oxygen atmosphere when depositing a thin metal layer on the resin film by dry plating has also been studied. With respect to a manufacturing method for a composite film having a layer structure consisting of resin film/metal layer, Patent Document 2 describes a method including: applying degassing process and vacuum-discharge-treatment process to a resin film; and subsequently forming a metal layer by sputtering, wherein these processes are carried out as continued sequence in an inert gas atmosphere with an oxygen concentration of 0.01% or less.

CONVENTIONAL ART DOCUMENT

Patent Document

[Patent Document 1] JP Patent 4924843 B

[Patent Document 2] JP Patent 4646580 B

SUMMARY OF THE INVENTION

In metal clad laminates circuit patterns are formed by etching the metal layer on the surface. While etching, miniaturization of circuits is subject to restrictions due to the thickness of the metallic foil. As a method for forming miniaturized circuits on a resin film, so-called printed electronics has also been studied, where the circuits are printed on the resin film utilizing metallic nanoparticles. However, under the present level, the circuits formed by the printing is not durable at high frequency conditions due to larger electrical resistance compared to the circuits formed of a metallic foil.

Patent Document 1 shows that, in the metallizing method by dry plating, a two-layer flexible circuit board with high adhesion of the copper conductor layer and high insulation reliability can be provided by controlling the oxygen atom dissolved in the underlying metal layer to 3.1 to 3.8 atom % as a component of solid-solution. Although liquid crystal polymer film is mentioned as an option for the insulation layer, polyimide film which has higher transmission loss than liquid crystal polymer film is used in examples. In the examples, deposition of the substrate and copper layer is carried out by sputtering, and the reduction of transmission loss is not considered.

In contrast to the conventional methods of glow discharge and sputtering under the presence of oxygen, Patent Document 2 describes a method in which all processes from degassing of the resin film, surface treatment by vacuum discharge, till formation of the metal layer by sputtering are performed under a vacuum that eliminates oxygen as much as possible. This process improves the peeling strength between the resin film and the metal layer. However, Patent Document 2 does not describe the suppression of the reaction between the metal layer and the oxygen originating from the resin film itself. In addition, in the example, polyimide film is used as the resin film, and the reduction of transmission loss is not considered.

The object of the present invention is to provide a metal-coated liquid-crystal polymer film that is suitable for microcircuit processing and capable of reducing the transmission loss of circuits by reducing the thickness of the conductor layer (metal layer) formed on the surface of the liquid crystal polymer film.

A metal-coated liquid-crystal polymer film according to the present invention comprises:

a polymer film main body comprising a polymer (thermoplastic liquid crystal polymer) capable of forming an optically anisotropic melt phase;

a first metal layer layered on at least one side of the polymer film main body; and a second metal layer layered on the first metal layer, wherein in an analysis of oxygen concentration in a thickness direction using XPS, an average oxygen concentration of the first metal layer is 2.5 atom % or less (preferably 2.0 atom % or less).

It is preferable that a peak value of the oxygen concentration in the thickness direction of the first metal layer is 4.5 atom % or less (preferably 4.0 atom % or less).

The first metal layer may contain one or two or more selected from the group consisting of chromium, tin, iron, copper, cobalt, zinc, molybdenum and nickel.

The second metal layer may be a metal selected from the group consisting of copper, gold, silver, and aluminum, or may be an alloy containing any one of copper, gold, silver, or aluminum.

The polymer film main body may have a linear expansion coefficient in a planar direction of 0 to 24 ppm/° C.

A metal clad laminate according to the present invention includes said metal-coated liquid-crystal polymer film in the laminate structure. The metal clad laminate may comprise the metal-coated liquid-crystal polymer film and a third metal layer layered on the second metal layer.

A method for producing said metal-coated liquid-crystal polymer film may comprise a process of depositing the first metal layer on at least one side one side or both sides) of the polymer film by sputtering.

According to the present invention, it is possible to provide a flexible circuit board capable of forming a circuit that exhibits reduced transmission loss and has fine line widths.

Any combination of at least two features disclosed in the appended claims and/or the specification should be construed as included within the scope of the present invention. In particular, any combination of two or more of the appended claims should be equally construed as included within the scope of the present invention.

BRIEF EXPLANATION OF DRAWINGS

This invention will be more clearly understood from the following description of suitable embodiments with reference to the accompanying drawings. However, the embodiments and drawings are for illustration and explanation only and should not be used to define the scope of the present invention. The scope of the present invention is defined by the appended claims.

DESCRIPTION OF THE EMBODIMENTS

Figure 1A:
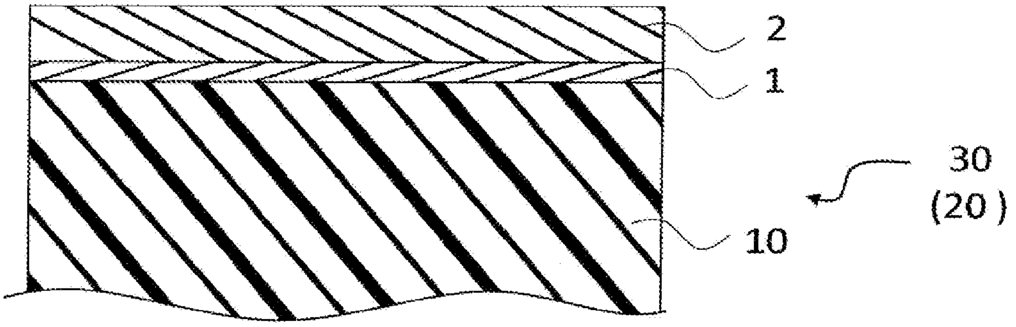
FIG. 1A is a schematic cross-sectional view illustrating an embodiment of a laminate structure of a metal-coated liquid-crystal polymer film and metal clad laminate according to the present invention.

A metal-coated liquid-crystal polymer film according to the present invention comprises a first metal layer laminated on at least one side of a film main body (thermoplastic liquid crystal polymer film) comprising a polymer (thermoplastic liquid crystal polymer) capable of forming an optically anisotropic melt phase, and a second metal layer laminated on the first metal layer. An XPS analysis of the oxygen concentration in the thickness direction shows that the average oxygen concentration in the first metal layer is 2.5 atom % or less. A peak value of oxygen concentration in the thickness direction of the first metal layer is preferably 4.5 atom % or less. The first metal layer of the metal-coated liquid-crystal polymer film may be formed by sputtering, and the second metal layer of the same may be formed by dry or wet plating. For example, the metal-coated liquid-crystal polymer film may comprise a first metal layer (first sputtered layer) formed by sputtering on the surface of the thermoplastic liquid crystal polymer film, and a second metal layer (second sputtered layer) formed by sputtering on the surface of the first metal layer.

A metal-coated resin film in which a metal layer as an underlayer is formed on the surface of the resin film as an insulating substrate by dry plating method and a metal layer as a conductor layer is laminated on said underlayer has been conventionally known, as exemplified in Patent Document 1. However, the present inventors have found that by using a thermoplastic liquid crystal polymer film as the resin film and by limiting the oxygen concentration of the underlayer to a predetermined value or less, transmission loss in the high frequency range can be reduced when a circuit is processed on the conductor layer. The present inventors have also found that using an oxygen-free atmosphere during dry plating is not sufficient to suppress the oxygen concentration in the underlying layer, and that it is necessary to control oxygen contamination originating from the resin film itself. If the first metal layer as the underlayer and the second metal layer are formed by dry plating such as sputtering, the metal layer formed on the insulating base material can be an ultra-thin metal layer with a thickness on the order of submicron's, which enables fine circuits to be processed on the metal layer by known methods such as etching. Therefore, miniaturization of circuit patterns and reduction of transmission loss in flexible circuit boards can both be achieved.

Base Material

In the present invention, thermoplastic liquid crystal polymer film is used as an insulating base material. It has been known that, compared to flexible circuit boards using polyimide as the insulating base material, flexible circuit hoards using thermoplastic liquid crystal polymer film as the insulating base material can further reduce transmission loss when circuits are processed. Where necessary, a single-sided metal clad laminate, in which a metal layer is formed on one side of the thermoplastic liquid crystal polymer film by a known method, may be used as a base material, and the following first metal layer may be formed on the other side (film side).

Liquid Crystal Polymer Film

The liquid crystal polymer film used in the present invention is formed from a polymer that can form an optically anisotropic melt phase. This polymer is not particularly limited in its chemical composition as long as it is a liquid crystal polymer that can be subjected to melt molding, but it is preferred, for example, to be made of a thermoplastic liquid crystal polymer. Examples of thermoplastic liquid crystal polymers include thermoplastic liquid crystal polyesters, or thermoplastic liquid crystal polyester amide to which an amide bond has been introduced.

The thermoplastic liquid crystal polymer may also be a polymer in which an isocyanate-derived bond such as an imide bond, a carbonate bond, a carbodiimide bond or an isocyanurate bond is further introduced into the aromatic polyester or aromatic polyesteramide.

Specific examples of the thermoplastic liquid crystal polymer used in the present invention may include known thermoplastic liquid crystal polyesters and thermoplastic liquid crystal polyester amides obtained from compounds classified as (1) to (4) as exemplified in the following, and derivatives thereof. However, it is needless to say that, in order to form a polymer capable of forming an optically anisotropic melt phase, there is a suitable range regarding the combination of various raw-material compounds.

(1) Aromatic or aliphatic diols (see Table 1 for representative examples)

TABLE 1

| Chemical structural formulae of representative examples of aromatic or aliphatic diols |
|---|
| 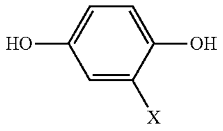 |
| X represents a hydrogen atom or a halogen atom, or a group such as a lower alkyl (e.g., $C_{1-3}$ alkyl) or a phenyl |
| 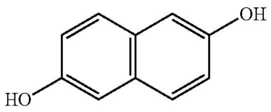 [SMILES: Oc1ccc2cc(O)ccc2c1] |
| 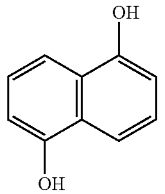 [SMILES: Oc1cccc2c(O)cccc12] |
| 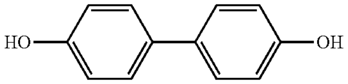 [SMILES: Oc1ccc(-c2ccc(O)cc2)cc1] |
| 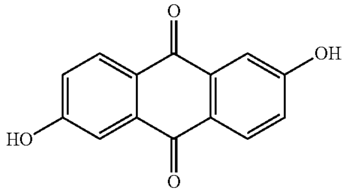 [SMILES: O=C1c2ccc(O)cc2C(=O)c2ccc(O)cc21] |
| 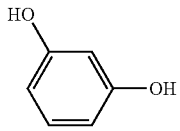 |
| 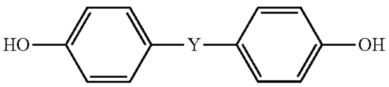 |
| Y represents a group such as —O—, —$CH_2$—, —S—, —CO—, —$C(CH_3)_2$—, or —$SO_2$— |
| $HO(CH_2)_nOH$ |
| n is an integer of 2 to 12 |

(2) Aromatic or aliphatic dicarboxylic acids see Table 2 for representative examples)

TABLE 2

| Chemical structural formulae of representative examples of aromatic or aliphatic dicarboxylic acids |
|---|
| 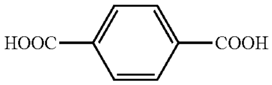 |
| 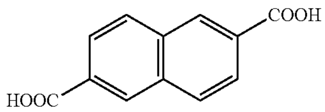 [SMILES: O=C(O)c1ccc2cc(C(=O)O)ccc2c1] |
| 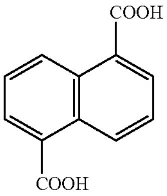 [SMILES: O=C(O)c1cccc2c(C(=O)O)cccc12] |
| 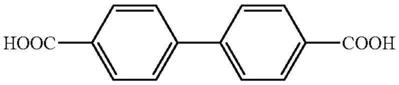 [SMILES: O=C(O)c1ccc(-c2ccc(C(=O)O)cc2)cc1] |
| 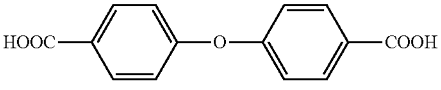 [SMILES: O=C(O)c1ccc(Oc2ccc(C(=O)O)cc2)cc1] |
| 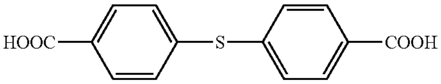 [SMILES: O=C(O)c1ccc(Sc2ccc(C(=O)O)cc2)cc1] |
| 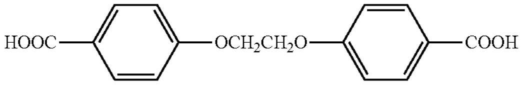 |
| 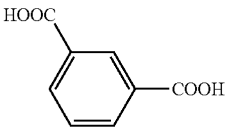 [SMILES: O=C(O)c1cccc(C(=O)O)c1] |
| $HOOC(CH_2)_nCOOH$ |
| n is an integer of 2 to 12 |

(3) Aromatic hydroxycarboxylic acids (see Table 3 for representative examples)

TABLE 3

| Chemical structural formulae of representative examples of aromatic hydroxycarboxylic acids |
|---|
| 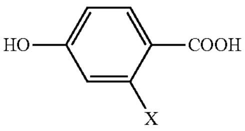 |
| X represents a hydrogen atom or a halogen atom, or a group such as a lower alkyl (e.g., $C_{1-3}$ alkyl) or a phenyl |
| 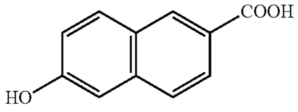 [SMILES: O=C(O)c1ccc2cc(O)ccc2c1] |

TABLE 3-continued

| Chemical structural formulae of representative examples of aromatic hydroxycarboxylic acids |
|---|
| 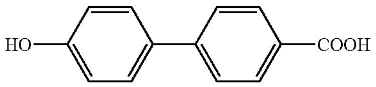 [SMILES: O=C(O)c1ccc(-c2ccc(O)cc2)cc1] |
| 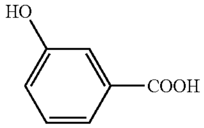 |

(4) Aromatic diamines, aromatic hydroxy amines, and aromatic aminocarboxylic acids (see Table 4 for representative examples)

TABLE 4

| Chemical structural formulae of representative examples of aromatic diamines, aromatic hydroxy amines, or aromatic aminocarboxylic acids |
|---|
| 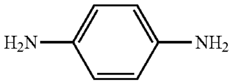 |

TABLE 4-continued

| Chemical structural formulae of representative examples of aromatic diamines, aromatic hydroxy amines, or aromatic aminocarboxylic acids |
|---|
| 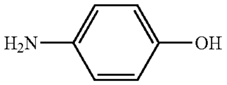 |
| 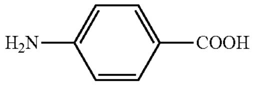 |

Representative examples of thermoplastic liquid crystal polymers obtained from these raw-material compounds may include copolymers having structural units shown in Tables 5 and 6.

TABLE 5

| Representative examples (1) of thermoplastic liquid crystal polymer | | | |
|---|---|---|---|
| (A) | 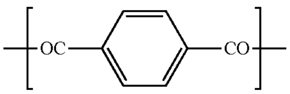 | 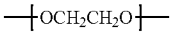 | 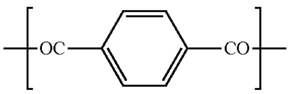 |
| (B) | 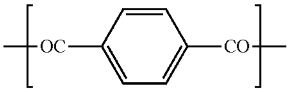 | 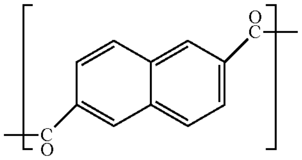 | 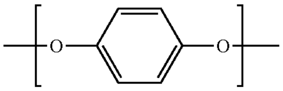 |
| (C) | 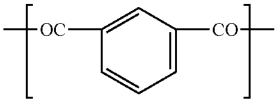 | 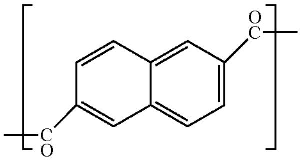 | 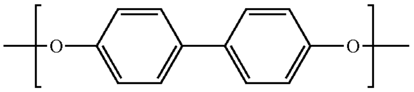 |
| (D) | 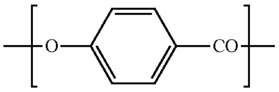 | 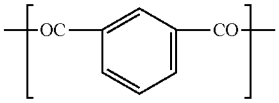 | 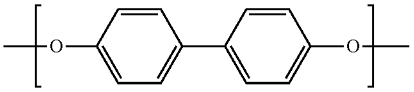 |
| (E) | 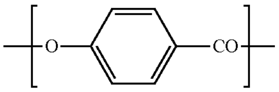 | 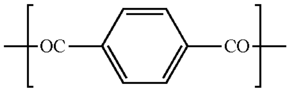 | 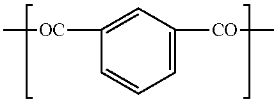 |
| | 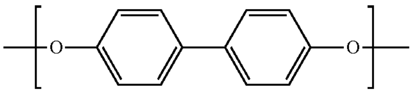 | | |

TABLE 5-continued
| Representative examples (1) of thermoplastic liquid crystal polymer | |
|---|---|
| (F) | 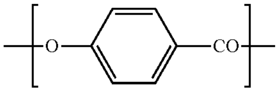 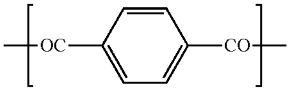 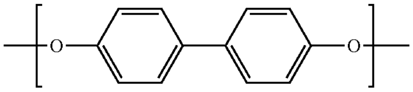 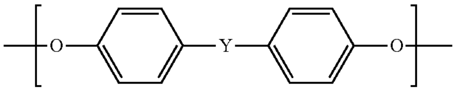 Y is a group such as —O—, —S—, or —$CH_2$— |
| (G) | 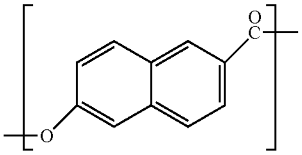 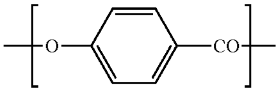 |
| (H) | 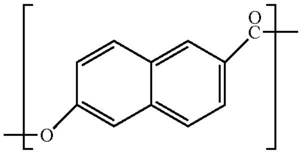 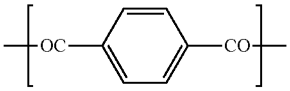 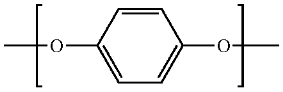 |
| (I) | 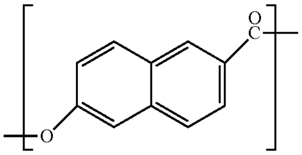 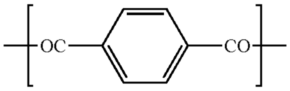 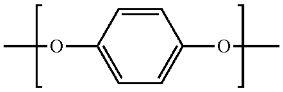 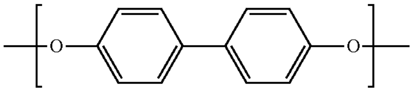 |
| (J) | 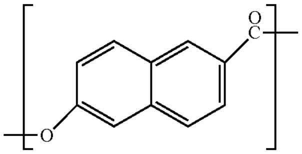 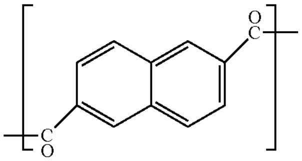 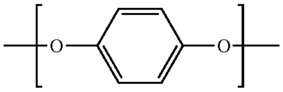 |
TABLE 6
| Representative examples (2) of thermoplastic liquid crystal polymer | |
|---|---|
| (K) | 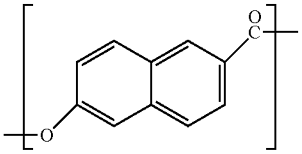 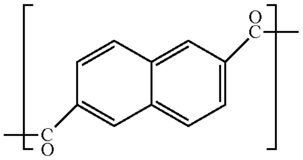 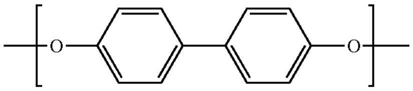 |
| (L) | 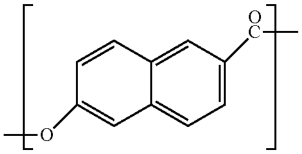 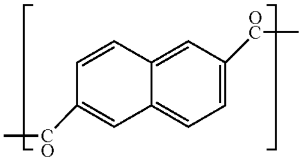 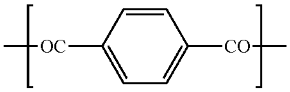 |

TABLE 6-continued
Representative examples (2) of thermoplastic liquid crystal polymer
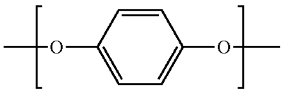
(M)
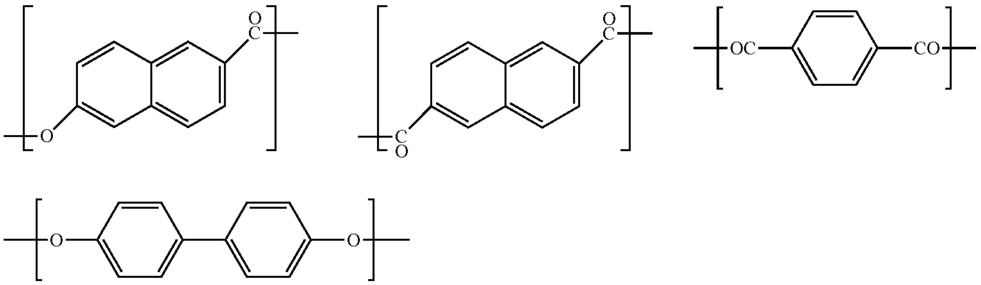
(N)
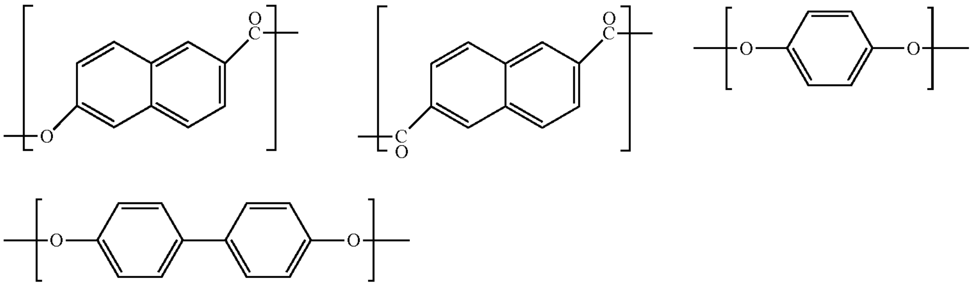
(O)
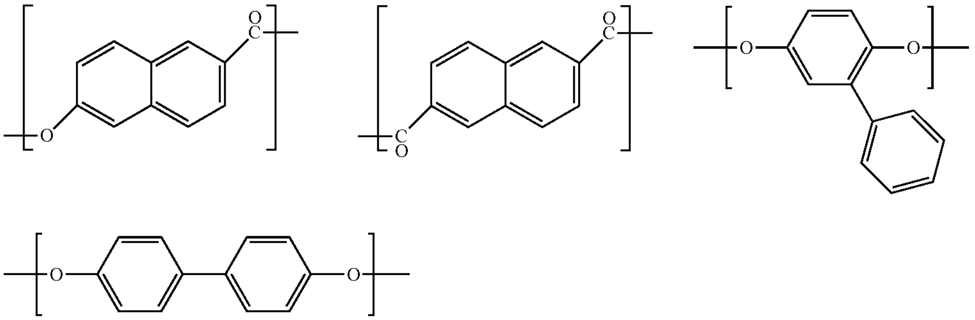
(P)
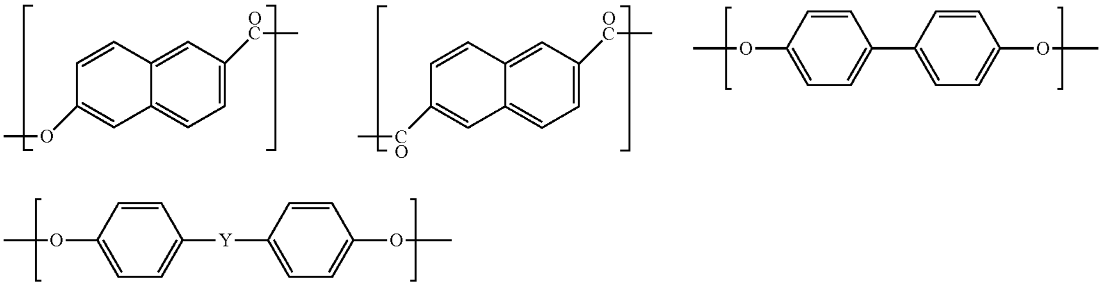
Y is a group such as —O—, —S—, or $—CH_2—$
(Q)
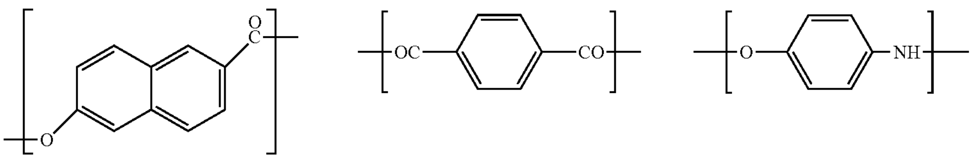

Of these copolymers, preferable polymers include at least p-hydroxybenzoic acid and/or 6-hydroxy-2-naphthoic acid as repeating units, and particularly preferred polymers include:

- a polymer (i) having repeating units of p-hydroxybenzoic acid and 6-hydroxy-2-naphthoic acid; or
- a copolymer (ii) having repeating units of
  - at least one aromatic hydroxycarboxylic acid selected from a group consisting of p-hydroxybenzoic acid and 6-hydroxy-2-naphthoic acid,
  - at least one aromatic diol, and
  - at least one aromatic dicarboxylic acid.

For example, in the case where the polymer (i) comprises a thermoplastic liquid crystal polymer having repeating units of at least p-hydroxybenzoic acid (A) and 6-hydroxy-2-naphthoic acid (B), the thermoplastic liquid crystal polymer may have a mole ratio (A)/(B) of preferably about (A)/(B) =10/90 to 90/10, more preferably about (A)/(B)=15/85 to 85/15, and further preferably about (A)/(B)=20/80 to 80/20.

Furthermore, in the case where the polymer comprises a thermoplastic liquid crystal polymer having repeating units of: at least one aromatic hydroxycarboxylic acid (C) selected from a group consisting of p-hydroxybenzoic acid and 6-hydroxy-2-naphthoic acid; at least one aromatic diol (D) selected from a group consisting of 4,4'-dihydroxybiphenyl, hydroquinone, phenylhydroquinone, and 4,4'-dihydroxydiphenyl ether; and at least one aromatic dicarboxylic acid (E) selected from a group consisting of terephthalic acid, isophthalic acid, and 2,6-naphthalene dicarboxylic acid, the thermoplastic liquid crystal polymer may have a mole ratio of about aromatic hydroxycarboxylic acid (C):aromatic diol (D):aromatic dicarboxylic acid (E)=30 to 80:35 to 10:35 to 10, more preferably about (C):(D):(E)=35 to 75:32.5 to 12.5:32.5 to 12.5, and further preferably about (C):(D):(E) =40 to 70:30 to 15:30 to 15.

Furthermore, the liquid crystal polymer may have a mole ratio of a repeating structural unit derived from 6-hydroxy-2-naphthoic acid to the aromatic hydroxycarboxylic acids (C), for example, of 85 mol % or higher, preferably 90 mol % or higher, and more preferably 95 mol % or higher. The liquid crystal polymer may have a mole ratio of a repeating structural unit derived from 2,6-naphthalene dicarboxylic acid to the aromatic dicarboxylic acids (E), for example, of 85 mol % or higher, preferably 90 mol % or higher, and more preferably 95 mol % or higher.

The aromatic diol (D) may include repeating structural units (D1) and (D2) derived from two different aromatic diols each selected from a group consisting of hydroquinone, 4,4'-dihydroxybiphenyl, phenylhydroquinone, and 4,4'-dihydroxydiphenyl ether. In such a case, the two aromatic diols may have a mole ratio (D1)/(D2)=23/77 to 77/23, more preferably 25/75 to 75/25, and further preferably 30/70 to 70/30.

Furthermore, the liquid crystal polymer may have a mole ratio of a repeating structural unit (D) derived from an aromatic diol to a repeating structural unit (E) derived from an aromatic dicarboxylic acid of preferably (D)/(E)=95/100 to 100/95. Deviation from this range may tend to result in a low degree of polymerization and deterioration in mechanical strength.

It should be noted that, in the present invention, optical anisotropy in a molten state can be determined by, for example, placing a sample on a hot stage, heating the sample at an elevating temperature under nitrogen atmosphere, and observing light transmitted through the sample.

A preferred thermoplastic liquid crystal polymer has a melting point (hereinafter, referred to as $Tm_0$) in a range of, for example, from 200° C. to 360° C., more preferably from 240° C. to 350° C., and more preferably $Tm_0$ is from 260° C. to 330° C. The melting point may be determined by observing thermal behavior of a thermoplastic liquid crystal polymer sample using a differential scanning calorimeter. That is, a melting point of a thermoplastic liquid crystal polymer sample may be determined by subjecting the sample to temperature elevation at a rate of 10° C./min to completely melt the sample, then to cooling the molten polymer at a rate of 10° C./min to 50° C., and again to temperature elevation at a rate of 10° C./min to determine the position of an endothermic peak that occurs after the second temperature elevation as the melting point of the thermoplastic liquid crystal polymer sample.

As long as the advantageous effect of the present invention is not deteriorated, to the thermoplastic liquid crystal polymer, may be added any thermoplastic polymer such as a polyethylene terephthalate, a modified polyethylene terephthalate, a polyolefin, a polycarbonate, a polyarylate, a polyamide, a polyphenylene sulfide, a polyether ether ketone, a fluorine-containing resin; various additives, and a filler etc.

The thermoplastic liquid crystal polymer film used in the manufacturing method of the present invention can be obtained, for example, by extrusion molding of a melt mixture of said thermoplastic liquid crystal polymers. Although method of extrusion molding is not limited to a specific one, the well-known T-die method, inflation method and the like are industrially advantageous. Especially in the inflation method, stress is applied not only in the direction of the mechanical axis of the thermoplastic liquid crystal polymer film (hereinafter abbreviated as MD direction), but also in the direction perpendicular to the mechanical axis (hereinafter abbreviated as TD direction). This allows the film to be stretched uniformly in both the MD and TD directions, and enables thermoplastic liquid crystal polymer films with controlled molecular orientation and dielectric properties in the MD and TD directions.

For example, in extrusion molding by the T-die method, a melt sheet extruded from a T-die can be simultaneously stretched not only in the MD direction of the thermoplastic liquid crystal polymer film but also in the T D direction, or a melt sheet extruded from a T-die may be stretched in the MD direction and then stretched in the TD direction to form a film.

In the extrusion molding by the inflation method, a predetermined draw ratio (corresponding to the stretch ratio in the MD direction) and a predetermined blow ratio (corresponding to the stretch ratio in the TD direction) are applied to the cylindrical sheet melt-extruded from the ring die to stretch the said sheet so as to form a film.

The stretch ratio of such extrusion molding may be about 1.0 to 10 as the stretch ratio (or draw ratio) in the MD direction. Preferably, the stretch ratio may be about 1.2 to 7, and even more preferably about 1.3 to 7. The stretch ratio (or blow ratio) in the TD direction may be, for example, about 1.5 to 20, preferably about 2 to 15, and even more preferably about 2.5 to 14.

As necessary, the melting point and/or coefficient of thermal expansion of the thermoplastic liquid crystal polymer film may be adjusted by carrying out a known or customary heat treatment. The heat treatment conditions can be set as desired according to the purpose. For example, the melting point (Tm) of the thermoplastic liquid crystal polymer film may be increased by heating the film for several hours at ($Tm_0$— 10°) C. or higher (for example, ($Tm_0$−10)

to ($Tm_0$+30°) C., preferably ($Tm_0$) to ($Tm_0$+20°) C.), with respect to the melting point ($Tm_0$) of the thermoplastic liquid crystal polymer.

The melting point (Tm) of the thermoplastic liquid crystal polymer film may fall within, for example, 270 to 380° C., preferably 280 to 370° C. The melting point (Tin) of the thermoplastic liquid crystal polymer film can be obtained by observing the thermal behavior of a thermoplastic liquid crystal polymer film sample using a differential scanning calorimeter. In other words, the position of the endothermic peak that appears when the temperature of a thermoplastic liquid crystal polymer film sample is increased at a rate of 10° C./min is obtained as the melting point (Tm) of the thermoplastic liquid crystal polymer film.

The thermoplastic liquid crystal polymer film may have a linear expansion coefficient in the plane direction of the film adjusted to about 0 to 24 ppm/° C. Liquid crystal polymer films having linear expansion coefficients approximately within this range are used as insulating base materials by circuit board manufacturers. For example, the linear expansion coefficient can be measured by the TMA method.

The thickness of the thermoplastic liquid crystal polymer film can be set according to the application. For example, the thickness may fall within 10 to 500 μm, preferably 15 to 250 μm, more preferably 25 to 180 μm, when considering its use as an insulating layer material for a multilayer circuit board.

Single-Sided Metal Clad Laminate

The metal-coated liquid-crystal polymer film according to the present invention may include the above-mentioned thermoplastic liquid crystal polymer film as a base material, having the following first and second metal layers formed on one side or both sides thereof. Alternatively, a single-sided metal clad laminate having a metal layer formed on one side of the thermoplastic liquid crystal polymer film by a known method may be used as the base material, and the following first and second metal layers may be formed on the other side where the thermoplastic liquid crystal polymer is exposed. This single-sided metal clad laminate as a base material may include the thermoplastic liquid crystal polymer film where metallic foil is bonded by thermocompression on its surface directly or via adhesive layer.

First Metal Layer

The first metal layer may contain one or two or more selected from the group consisting of chromium, tin, iron, copper, cobalt, zinc, molybdenum and nickel. For example, the first metal layer may be an alloy of two or more of these metals, and may also be an alloy to which other metals are added. The first metal layer may contain unavoidable impurities, but oxygen must be controlled below a predetermined concentration.

The first metal layer can be deposited by sputtering using the metal to be stacked as a target. It is preferable that the gas used for sputtering is oxygen-free argon gas. In this case, the oxygen included in the metal layer is considered to be derived from the liquid crystal polymer film being sputtered. By using a known sputtering method and adjusting conditions such as an output (current and voltage) during sputtering and an interval (duty ratio) of energization, contamination caused by the liquid crystal polymer film can be suppressed and the oxygen concentration in the first metal layer can be kept within a predetermined value.

Although the output (current and voltage) during sputtering is not particularly limited, for example, 10 to 1000 kW is preferable, 50 to 800 kW is more preferable, and 100 to 700 kW is further more preferable. Although the interval (duty ratio) of energization is not particularly limited, for example, 1.1 to 50% is preferable, 1.5 to 30% is more preferable, and 2.0 to 20% is further more preferable.

It is preferred that the first metal layer has an average oxygen concentration of 2.5 atom % or less in an analysis of oxygen concentration in the thickness direction using XPS (X-ray photoelectron spectroscopy). This allows a significant level of reduction of transmission loss in the high-frequency range when the second metal layer on the first metal layer as a conductor layer is processed to form a circuit. Further, an average oxygen concentration is preferably 2.0 atom % or less. Preferably, the first metal layer has a peak value of oxygen concentration in the thickness direction of 4.5 atm % or less. Further preferably, the peak value of oxygen concentration is 4.0 atm % or less.

Although the thickness of the first metal layer is not particularly limited, the thickness is preferably 5 nm or more and 50 nm or less. If the thickness of the first metal layer is too thin, the effect of improving the adhesion of the second metal layer cannot be obtained. Further, it is also difficult to control the average oxygen concentration to low level. On the other hand, if a metal with different conductivity from the second metal layer is used as the first metal layer, it will be difficult to control transmission loss if the first metal layer is too thick. It is more preferable that the thickness of the first metal layer falls within 30 nm or less, further preferably 20 nm or less.

Second Metal Layer

The second metal layer is layered (stacked) on top of the above first metal layer. The second metal layer may comprise a metal selected from the group consisting of copper, gold, silver, and aluminum, or an alloy containing any one of copper, gold, silver, or aluminum. The manufacturing method of the second metal layer is not limited to a specific one, but it is preferred to form the second metal layer as a plated layer by plating. The plating method may be dry plating such as sputtering, ion plating, vacuum deposition, CVD, etc., or wet plating (electrolytic plating). For example, the second metal layer may be formed by sputtering in the same manner as the first metal layer.

Although the thickness of the second metal layer is not particularly limited, the thickness is preferably 50 nm or more and 400 nm or less, more preferably 300 nm or less. In a metal clad laminate formed by thermocompression bonding of a metallic foil (e.g., rolled copper foil) onto a base material, such as liquid crystal polymer film, a conductor layer with a thickness below a certain level cannot be obtained due to the constraints of the thickness of the metallic foil. On the other hand, when the second metal layer is layered by plating on top of the first metal layer, a conduct layer with arbitrary thickness can be formed. In the case of processing the conduct layer to form a circuit by known methods such as chemical etching, fine circuit processing can be carried out where the conduct layer is thin.

Metal Clad Laminate

Figure 1B:
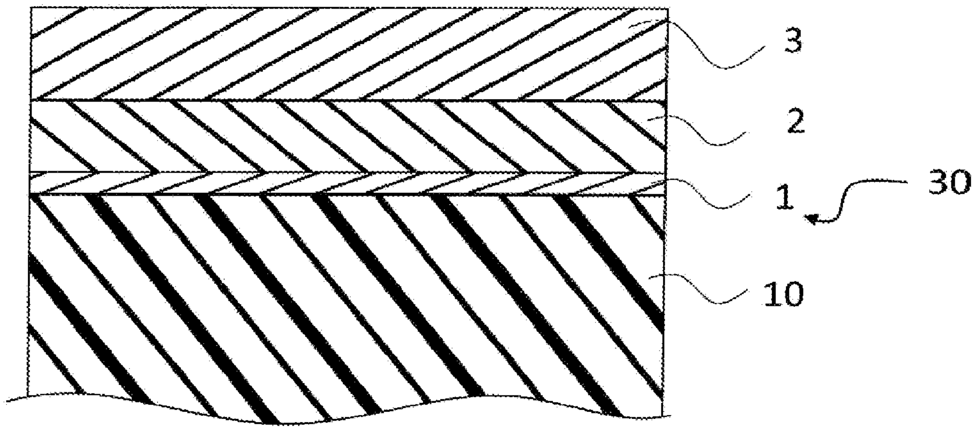
FIG. 1B is a schematic cross-sectional view illustrating another embodiment of the laminate structure of the metal clad laminate according to the present invention.
Figure 1C:
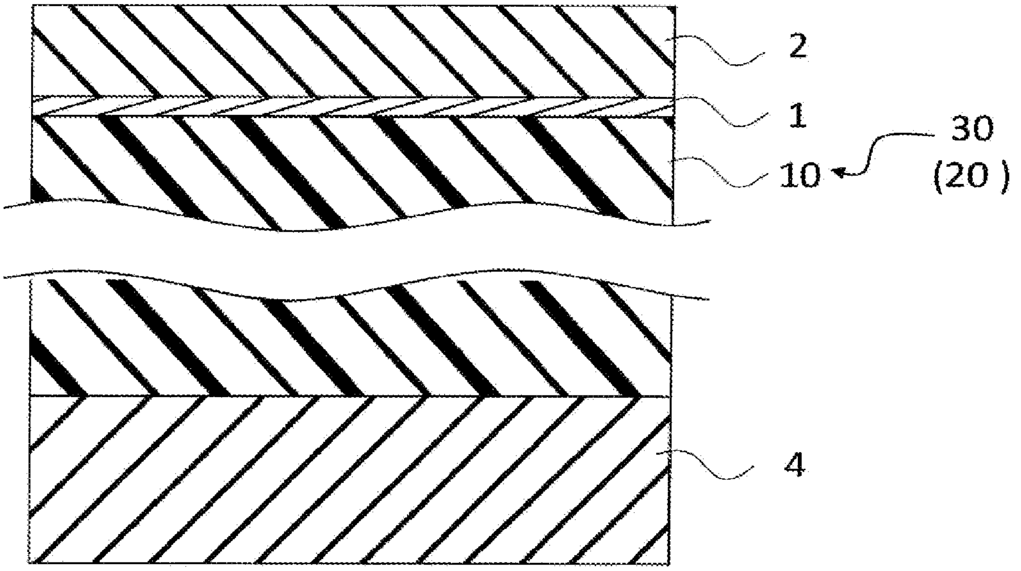
FIG. 1C is a schematic cross-sectional view illustrating another embodiment of the laminate structure of the metal clad laminate according to the present invention.

The metal clad laminate according to the present invention is made of the above-mentioned metal-coated liquid crystal polymer film or includes the above-mentioned metal-coated liquid crystal polymer film. For the sake of explanation, a schematic cross-sectional view of a portion of the configuration of the metal clad laminate 30 is shown in FIGS. 1A, 1B, 1C. The figures are merely schematic diagrams to illustrate the laminate structure, and the width of the figures and the thickness ratios of the various parts do not indicate the actual ratios. In one embodiment, the metal-coated liquid crystal polymer film 20 according to the present invention can be used as a circuit board material by forming the second metal layer 2 to the desired thickness.

Accordingly, the metal clad laminate 30 provided by the present invention may comprise a thermoplastic liquid crystal polymer film 10, a first metal layer 1, and a second metal layer 2 (see FIG. 1A).

In another embodiment, the metal clad laminate 30 may further comprise a third metal layer 3 (hereinafter referred to as the “third metal layer”) layered on to the second metal layer 2 (see FIG. 1B). The third metal layer may also be formed by either dry or wet plating. For example, after stacking the first metal layer 1 and the second metal layer 2 by dry plating method such as sputtering, the third metal layer 3 may be deposited on the second metal layer 2 by electrolytic plating. Here, in the same manner as metal layer 2, the third metal layer 3 may be one selected from copper, gold, silver, and aluminum, or may comprise an alloy containing any one of copper, gold, silver, or aluminum. In such cases, the third metal layer 3 may be formed from the same metal as the second metal layer 2. Thus, a metal clad laminate 30 where the conductor layer (second metal layer) 2 of the above metal-coated liquid crystal polymer film 20 is thickened can be obtained. When the first and second metal layers are formed on both sides of the thermoplastic liquid crystalline polymer film 10 (not shown), the third metal layer 3 may be formed only on the second metal layer 2 on one side, or the third metal layer 3 may be formed on the second metal layer 2 on both sides, respectively. The thickness of the third metal layer is not particularly limited, but may be fall within 1 to 20 μm, preferably 1 to 5 μm.

In another embodiment, a metal clad laminate 30 (see FIG. 1C) where a first metal layer 1, a second metal layer 2, and if necessary, a third metal layer 3 are formed on one side of a thermoplastic liquid crystal polymer film, and a metal layer is formed on the other side by a known method such as thermocompression bonding of metal foil 4 is also included in the present invention. In such a case, as described above, a one-sided metal clad laminate produced by a known method such as thermocompression bonding of metallic foil 4 is used as a base material, and a first metal layer 1, a second metal layer 2, and optionally, a third metal layer 3 may be provided on the other side. Alternatively, after a first metal layer 1, a second metal layer 2, and optionally, a third metal layer 3 is provided on one side of the thermoplastic liquid crystal polymer film 10, a metal layer may be provided on the other side by a known method such as thermocompression bonding of metallic foil 4.

According to the present invention, compared to the case of using a metallic foil on one side or both sides of a thermoplastic liquid crystal polymer film, it is possible to provide a metal-coated liquid crystal polymer film capable of reducing transmission loss to a significant level and having a metal layer thinner than the metal foil. For example, when circuits are formed by known methods such as chemical etching, thinner conductor layer enables finer circuit processing. By using the metal-coated liquid crystal polymer film according to the present invention, it is possible to provide a flexible circuit board of reduced transmission loss (improved high frequency characteristic) and having a suppressed size.

EXAMPLES

As a liquid crystal polymer film, a film comprised of VECSTAR (registered trademark) (melting point 310° C. according to DSC, thickness 50 μm, linear expansion coefficient 15 ppm/° C. by TMA method) manufactured by KURARAY CO., LTD. was used as an insulating base material. The film was installed in a roll-to-roll type sputtering system. After evacuating the system to form a vacuum, using oxygen-free high-purity argon gas, a sputtered film (first metal layer) with a thickness of 15 nm was deposited on the film by means of sputtering of NiCr target (Ni 80 wt % Cr 20 wt %). Next, the target was changed to Cu, and Cu layer (second metal layer) with a thickness of 120 nm was deposited onto the first metal layer. The resulting metal-coated liquid crystal polymer film was analyzed by X-ray photoelectron spectroscopy (XPS) (ULVAC-PHI, Inc. PHI5000 VersaProbe 2) while etching from the surface of the second metal layer to the substrate-film surface by (Ar) ion and analyzing in the depth direction, thereby the average oxygen concentration in the first metal layer and the maximum oxygen concentration (peak value) were determined. A nickel alloy layer was defined as an area where the nickel alloy was present, and the averaged ratio of oxygen present in the nickel alloy layer was defined as the average oxygen concentration.

The above process was carried out in four different ways, while changing only the sputtering conditions of the NiCr target, and the results are shown in Example 1, Example 2, Comparative Example 1, and Comparative Example 2. Of these, in Examples 1 and 2 and Comparative Example 1, sputtering was performed intermittently at high power, whereas in Comparative Example 2, sputtering was performed steadily at low power. The results are shown in Table 7.

For each metal-coated liquid crystal polymer film, the Cu layer was thickened to 12 μm by electrolytic plating so as to make a metal clad laminate. In the laminate, a microstrip line of 100 to 120 μm in width was fabricated by chemical etching. Then, by using a microwave network analyzer (manufactured by Agilent Technologies, Inc., product name: 8722ES) and a probe (manufactured by Cascade Microtech, product name: ACP40-250), transmission loss was measured under the conditions from 0.05 to 67 GHz. The measurement results at 60 GHz were compared. When the microstrip lines of different width were compared, all showed the same trend. Therefore, the value for a microstrip line width of 110 μm was used as a representative value.

TABLE 7

| | Ex. 1 | Ex. 2 | Com Ex. 1 | Com Ex. 2 |
|---|---|---|---|---|
| Maximum output power (kW) in stacking NiCr layer | 675 | 105 | 1275 | 5 (stationary) |
| Duty ratio (%) | 2.0 | 16.0 | 1.0 | 100 |
| Average oxygen concentration in NiCr layer (atom %) | 1.8 | 1.6 | 2.8 | 2.7 |
| Peak oxygen concentration in NiCr layer (atom %) | 3.4 | 3.4 | 6.6 | 4.8 |
| Transmission loss (dB/100 mm) 60 GHz | −9.4 | −9.6 | −9.9 | −10.1 |

In Comparative Example 2, where stationary sputtering was performed at low power, the oxygen concentration in the first metal layer was outside the range of the present invention. In Comparative Example 1, contamination from the liquid crystal polymer film occurred at the start of sputtering because the maximum output power was set too high. As a result, the oxygen concentration in the first metal layer was not reduced, and no significant difference in transmission loss was observed compared to Comparative Example 2. On the other hand, in Examples 1 and 2, the effect of transmission loss reduction was confirmed.

INDUSTRIAL APPLICABILITY

The metal-coated liquid-crystal polymer film of the present invention can reduce the transmission loss of flexible circuit boards and reduce the line width, making it highly applicable as a high-frequency circuit board material.

Although the present invention has been described in terms of the preferred Example thereof, those skilled in the art would readily arrive at various changes and modifications in view of the present specification without departing from the scope of the invention. Accordingly, such changes and modifications are included within the scope of the present invention defined by the appended claims.

EXPLANATION OF REFERENCES

1 first metal layer
2 second metal layer
3 third metal layer
4 metallic foil
10 liquid crystal polymer film
20 metal-coated liquid-crystal polymer film
30 metal clad laminate

What is claimed is:

1. A metal-coated liquid-crystal polymer film comprising:

a polymer film main body comprising a polymer capable of forming an optically anisotropic melt phase, the polymer film main body having a first surface and a second surface opposite to the first surface;

a first metal layer layered on the first surface of the polymer film main body; and a second metal layer layered on the first metal layer, wherein the first metal layer has an average oxygen concentration of 2.5 atom % or less measured in a thickness direction over the entire thickness of the first metal layer using XPS.

2. The metal-coated liquid-crystal polymer film according to claim 1, wherein a peak value of the oxygen concentration over the entire thickness of the first metal layer is 4.5 atom % or less.

3. The metal-coated liquid-crystal polymer film according to claim 1, wherein the first metal layer contains one or two or more selected from the group consisting of chromium, tin, iron, copper, cobalt, zinc, molybdenum and nickel.

4. The metal-coated liquid-crystal polymer film according to claim 1, wherein the second metal layer comprises a metal selected from the group consisting of copper, gold, silver, and aluminum, or an alloy containing any one of copper, gold, silver, or aluminum.

5. The metal-coated liquid-crystal polymer film according to claim 1, wherein a linear expansion coefficient of the polymer film in a planar direction falls within 0 to 24 ppm/° C.

6. A metal clad laminate comprising:

the metal-coated liquid-crystal polymer film according to claim 1; and a third metal layer layered on the second metal layer.

7. The metal-coated liquid-crystal polymer film according to claim 1, further comprising a metallic foil on the second surface of the polymer film main body.

8. The metal-coated liquid-crystal polymer film according to claim 1, further comprising a further first metal layer layered on the second surface of the polymer film main body and a further second metal layer layered on the further first metal layer on the second surface, wherein the further first metal layer has an average oxygen concentration of 2.5 atom % or less measured in a thickness direction over the entire thickness of the further first metal layer using XPS.

9. The metal-coated liquid-crystal polymer film according to claim 8, wherein a peak value of the oxygen concentration over the entire thickness of the further first metal layer is 4.5 atom % or less.

10. The metal-coated liquid-crystal polymer film according to claim 8, wherein the further first metal layer contains one or two or more selected from the group consisting of chromium, tin, iron, copper, cobalt, zinc, molybdenum and nickel.

11. The metal-coated liquid-crystal polymer film according to claim 8, wherein the further second metal layer comprises a metal selected from the group consisting of copper, gold, silver, and aluminum, or an alloy containing any one of copper, gold, silver, or aluminum.

12. The metal-coated liquid-crystal polymer film according to claim 8, wherein a linear expansion coefficient of the polymer film in a planar direction falls within 0 to 24 ppm/° C.

13. A metal clad laminate comprising:

the metal-coated liquid-crystal polymer film according to claim 8; and a third metal layer layered on the second metal layer.

14. The metal clad laminate according to claim 13, comprising a further third metal layer layered on the further second metal layer.

15. A method for producing the metal-coated liquid-crystal polymer film according to claim 8, comprising depositing the further first metal layer on the second surface of the polymer film main body by sputtering.

16. A method for producing the metal-coated liquid-crystal polymer film according to claim 1, comprising depositing the first metal layer on the first surface of the polymer film main body by sputtering.

* * * * *